United States Patent Office 3,544,434

Patented Dec. 1, 1970

3,544,434

THICK FILM CAPACITORS FOR MINIATURIZED CIRCUITRY

Ronald R. Giller, Danbury, and Milton Schneider, Norwalk, Conn., and William J. Condon and Alfred F. Torrisi, Bennington, Vt., assignors of one-half each to Dictograph Products, Inc., Danbury, Conn., a corporation of Delaware, and Transitor Electronics, Inc., Bennington, Vt.

No Drawing. Filed Oct. 29, 1968, Ser. No. 771,641
Int. Cl. C23f *17/00*; H01g *9/00*
U.S. Cl. 204—38 10 Claims

ABSTRACT OF THE DISCLOSURE

A method for manufacturing miniature printed circuit capacitive elements in which a thick film mixture containing a finely divided valve-forming metal and glass in a binder is applied to a conductive metal surface formed on a printed circuit insulative substrate. Heat is then applied for a time sufficient to solidify the film and render it porous, and the film anodized to form or "grow" a dielectric oxide film of the metal. Subsequently a solid conductive electrolytic layer is formed over the oxide layer, and the capacitive element is completed by forming a metallic layer in contact with the electrolytic layer to complete the cathode system. In order to prevent migration of the conductive electrolyte through the dielectric oxide film, an intermediate continuous layer may be applied to the conductive substrate surface by baking a mixture of finely divided particles of the valve-forming metal, a non-film forming metal and glass in a binder.

BACKGROUND OF THE INVENTION

This invention relates to the manufacture of capacitive elements for printed circuits and the like and, more particularly, to a method using depositing techniques for directly forming on small printed circuit substrates miniature capacitive elements having a high capacitance per unit area and which become an integral part of the printed circuit.

The advantages and need for miniaturization of electrical circuits and circuit elements are now firmly established with the development of reliable miniaturized active networks. Keeping pace with this development, certain strides have been taken in reducing the physical size of passive elements, particularly resistors and, to some extent, capacitors. Nevertheless, although capacitors of small physical size are now available, there have been few successful developments enabling quality capacitive elements to be directly formed as an integral part of a printed or miniaturized circuit substrate, while at the same time achieving a relatively high capacitance per unit area.

Many present capacitors for printed circuit applications are miniaturized capacitors using a valve-forming metal, such as tantalum, and an electrolyte, ether "wet" or "solid." A large portion of the so-called printed circuit capacitors, on the other hand, comprise a fired ceramic plate or disc providing faces upon which are formed a metal layer of, for example, silver, each layer being one of the capacitor electrodes. Subsequently, the capacitive disc is joined electrically to a printed silver pattern on a ceramic substrate. The whole structure may then be encapsulated. Capacitors of the latter type, are generally fabricated from a ceramic of high dielectric constant, such as one of the titanates, to obtain a dielectric material offering a reasonably high capacitance.

Other miniture capacitive elements include those which are formed by compression molding a bonded ceramic dielectric to a metallic electrode which is part of the metallic printed circuit pattern. A method for forming capacitors of this type is disclosed in U.S. Pat. No. 2,937,410 to Davies et al. Still other efforts to miniaturize capacitors include a procedure in which film-forming metal particles are compressed into a porous, or sintered, body that is subsequently permeated with a liquid electrolyte. Later, the structure is pyrolitically converted into a dry electrolyte film in intimate contact with the particles of the compressed structure. In the latter type of capacitor, the resultant structure is generally encased in a metallic cylinder and leads are added for attachment to the circuit by conventional soldering.

Although the advances toward miniaturization of capacitive elements have resulted in a substantial decrease in the ratio of the physical size of a capacitor to its capacitance value, by and large those capacitors are still individual elements which must be attached by conventional techniques to the printed circuit.

SUMMARY OF THE INVENTION

In accordance with the present invention, quality "solid" electrolytic capacitors are formed directly and integrally with the printed circuit by applying over the metal surface of the printed circuit substrate a thick film mixture containing a finely divided film-forming metal and glass in a suitable binder, preferably a thermally decomposable compound. This invention utilizes, but is not necessarily limited to, a film-forming metal as one electrode. By film-forming metal we mean those corrosion resistant, refractory metals which are capable of being coated or covered on their surface with an anodically stable dielectric oxide film, which constitutes the dielectric material of the capacitor. Among such metals are tantalum, aluminum, zirconium, titanium, niobium, tungsten, hafnium, and their alloys. These metals have been called "valve metals" or "film-forming" metals because they are capable of electrolytically forming the dielectric oxide film on the surfaces when they act as anodes in an electrolytic, film-forming solution. In the case of tantalum, the film is understood to consist largely, if not wholly, of amorphous tanalum pentoxide.

The thick film of the selected metal is subjected to heat for a time sufficient to solidify the film and render it porous to serve as one electrode of the capacitor. Thereafter, the solidified film is exposed to an oxidizing environment to form a dielectric oxide layer of the film-forming metal, constituting the dielectric of the capacitor. Next, a solid electrotype layer is applied on top of the oxide layer by conventional methods, followed by application of a metallic layer to complete the cathode system.

A preferred capacitor according to the invention is produced by preceding application of the thick film with a layer of a mixture including finely divided particles of the film forming metal, a non-film forming metal and glass in a binder. This layer is screened directly on the substrate surface and heated at a temperature and for a time sufficient to produce a substantially continuous interface layer that operates to prevent shorting of the electrolyte to the metal substrate surface through the later-formed oxide film.

The method will now be described in more detail, with reference to one or more examples of specific procedures for producing capacitors according to the invention.

DESCRIPTION OF THE INVENTION

A substrate which is to carry the circuit with which the capacitor is to be formed is first provided with a conductive surface, referred to as a pad, or land, to which electrical connections ultimately are made to other parts of the circuit. Methods for providing passive elements with suitable electrical connections to such pads or lands are known per se, and therefore, no further discussion of the manner of application of the leads will be given.

There are several choices of methods and materials available for forming the pads. Generally, any suitable metallic substance may be used to form the conductive pad on the substrate upon which the capacitor is to be formed; however, it has been found preferable to use for this purpose one of the noble metals (such as gold) or the valve-forming, or film-forming, metal which is to be used as the capacitor electrode. Having chosen the material to be used in forming the pads on the substrate, it may then be applied by one of several methods. In one such method, the valve-forming metal (e.g., tantalum) is vapor-deposited on the substrate to form a thin tantalum film. Other methods are to employ vapor-phase deposition of $TaCl_5$ or to sputter-deposit the valve-forming metal directly on the substrate.

In another method for forming the conductive pad, a mixture containing gold powder, glass particles and a vehicle is screen printed on the substrate to form a thick film. After drying, the film is subjected to heat-treatment at a temperature of not less than about 300° C,. and preferably about 1000° C., for 5 to 10 minutes. A tantalum foil layer, plain or etched, secured to the substrate may also be used for the pad, if desired.

After the conductive metal pad has been formed, a thick film including a valve-forming metal may be applied over the surface of the pad. When completed, this film serves as one of the capacitor electrodes and, in a unipolar capacitor, it will generally be the anode. As will be brought out shortly, however, an intermediate nonporous layer may be formed on the pad prior to application of the thick electrode film. In the preferred method for forming the anode and dielectric of the capacitor, a mixture of tantalum (or other film-forming metal) powder, glass powder and a binder is screened in one or more successive layers onto the conductive pad. This results in a thick film or layer which is then heated in order to bond the application to the conductive surface of the substrate and render the anodic layer porous. It should be noted that the term "thick film" as used herein refers to films having thicknesses on the order of .001 inch. "Thin films", on the other hand, generally designate those films having thicknesses in the Angstrom range. The thicknesses of thin films generally fall in the range of one to several microinches.

Tantalum powder mixtures suitable for use with the invention are generally those having a large micro-farad-volt per gram ratio or, alternatively, providing a large surface area to volume ratio. Of course, other types of powders may be used to achieve the desired capacitance values for any given physical size. One commercial powder used successfully in the process described is type HPRM, produced by the Kawecki Chemical Company. Heating, or baking, of the metal-glass powder mixture is preferably carried out at a temperature not less than 300° C. in an oxidizing or non-oxidizing atmosphere, but desirably in an inert gaseous or vacuum atmosphere at temperatures above 400° C. to prevent oxidation, particularly when using tantalum.

In one test capacitor, a tantalum-glass powder in a vehicle was found to result in the desired solid porous anode structure when baked at a temperature of 550° C. until decomposition of the vehicle and bonding of the mixture to the substrate were complete. The vehicle leaves the mixture at this baking temperature to form the pores in the electrode, while the glass forms a slag to fuse the metal powder mixture and create the necessary bond.

As is well known, the value C of any capacitance is given by the expression $C=kA/t$, where $k$ is a constant including the dielectric constant $\epsilon$ of the dielectric between the capacitor electrodes, A is the area of the electrodes exposed to the dielectric and $t$ is the thickness of the dielectric. In order, therefore, to obtain high capacitance from a small capacitive element, it is necessary to either increase the area A of the electrodes (thereby requiring a physical increase in the size of the capacitor), utilize a dielectric medium having a high dielectrc constant, or decrease the dielectric thickness $t$ between electrodes.

In the present invention, the effective area of the electrodes, that is, the effective area of the thick film deposit, is increased by rendering the film porous to expose a large surface area to the dielectric, and by using the first instance a film-forming metal from which a dielectric oxide film of high dielectric strength can be grown. The oxides of film-forming metals such as tantalum are extremely good insulators having a dielectric strength of approximately $10^4$ volts/mils, as compared to about $2.3\times10^3$ volts/mil for mica.

In another procedure, the valve-forming metal in a finely-divided state may be sintered directly on the conductive surface (preferably prepared from the same metal) as an alternative to application of the thick film by screen printing.

The dielectric film (e.g., $Ta_2O_5$) is formed on the printed or sintered anodic layers by methods known in the art. This may be accomplished, for example, by making the film-forming layer the anode in an electrolytic process carried out in an aqueous acid solution. A typical solution for the electrolytic film-forming process is phosphoric acid. The desired film thickness may be obtained by adjusting the applied voltage between the film-forming anode and a cathode in the electrolytic solution. A $Ta_2O_5$ dielectric film of approximately 500 Angstroms can be formed, for example, at 35 volts applied between the electrodes in a phosphoric acid bath.

After the dielectric film has been formed on the anode, a wet electroylte paste containing, for example, $Mn(NO_3)_2$ is applied to the dielectric film in one or more layers and allowed to soak into the porous electrode. The electrolyte paste is then heated at a temperature of about 300° C. for a time sufficient to pyrolitically convert it into the solid electrolyte compound $MnO_2$. Subsequently, the cathode system is completed by applying to the $MnO_2$ layer a conductive layer of any suitable metal, such as silver, which may or may not be preceded by a layer of graphite. Again, the silver may be in the form of a silver paste or finely divided conductive particles in a binder, which may be subjected to heat treatment to solidify the metallic layer. The capacitor is now ready and electrical connections between the conductive layer and the circuit may be made by any suitable known method. Capacitors formed in the above-desired process have been found to yield capacitance values of 75–100$\mu$ f./in.$^2$.

In manufacturing capacitors according to the invention, it should be recognized that there may be a short circuit formed between the land metal and the formation electrolyte or the manganous nitrate electrolyte in the anodic formation step or during the pyrolytic conversion of the manganous nitrate to manganese dioxide.

The undesirable interference with the anodic formation occurs when both the anode and the land material are positively polarized in the formation solution and bath. If the land material is a non film-forming metal and is directly exposed to the formation solution, the anodization of the tantalum is prevented, and violent gassing occurs at the land, which may physically disrupt the thick film material. To prevent this, the land is kept out of contact with the solution by means of an applied barrier layer consisting of a mixture of tantalum gold, or, the land material itself is made of tantalum or another film-forming metal.

The undesirable interference in the pyrolytic conversion of the manganese dioxide layer occurs when this layer, which is negatively polarized, contacts both sides of the dielectric tantalum pentoxide film. This may be prevented by the above mentioned use of a tantalum or other film forming metal as a land, or by means of the tantalum-gold barrier layer. For the most part, this effect may be avoided by limiting the area of contact between the anodic layer and conductive pads on the substrate or by employing the further preferred steps in the manufacture of the capacitor.

In order to preclude undesired contact of the electrolyte with the land, application of the anode film to the substrate may be preceded by two or more successive layers of a special mixture producing a continuous barrier layer which is impervious to the electrolyte, while at the same time maintaining a conductive path between the conductive pad and the thick film anode. Such mixture is preferably capable of providing a film forming surface to the extent required to prevent shorting. One mixture found to yield satisfactory results for this purpose contained finely divided particles of gold, tantalum and glass in a vehicle. The barrier-forming layer is conveniently applied by screen printing techniques, dried and fired at about 600° C. and not less than 300° C. for approximately fixe minutes. When the electrolyte is subsequently applied, it is prevented from shorting to the conductive substrate surface by the barrier layer.

Although the invention has been described with reference to specific methods and examples thereof, it will be appreciated that certain variations and modifications in both the method and the capacitor will be apparent to those skilled in the art. For example, various configurations of the capacitor may be provided by varying the projected geometry on a substrate.

Moreover, although the invention has been described with reference to a unipolar capacitor, the techniques and procedures disclosed herein are generally applicable to the formation of non-polarized capacitors as well.

Accordingly, all such modifications and variations are intended to be included within the scope of the appended claims.

What is claimed is:

1. A method for manufacturing miniature printed circuit capacitive elements, comprising the steps of:
- forming on a substrate an integral conductive metal surface to form a connection to the positive portion of the element;
- applying over the conductive surface a thick film of a mixture containing a finely divided valve-forming metal in a binder;
- heating the applied thick film for a time sufficient to render it porous, the porous film constituting the anode for the element;
- anodizing the solidified film to form a dielectric oxide layer of the valve-forming metal;
- applying to the oxide layer a solid conductive electrolytic layer; and
- forming on the solid electrolytic layer a metallic layer to form a connection to the negative portion of the element.

2. A method as defined in claim 1, in which:
the conductive metal surface is formed by vapor depositing a layer of the valve-forming metal.

3. A method as defined in claim 1, in which:
the conductive metal surface is formed by sputtering a layer of the valve-forming metal on the substrate.

4. A method as set forth in claim 1, further comprising the steps of:
- applying to the integral conductive metal surface a layer of a mixture including finely divided particles of a film-forming metal, a non-film forming metal and glass in a binder;
- heating the applied mixture at a temperature and for a time sufficient to produce a substantially continuous barrier layer effective to preclude shorting of the electrolytic layer to the conductive surface, the thick film anodic mixture being applied to said barrier layer.

5. A method as defined in claim 4, in which:
each of said layers is applied by screen printing.

6. A method as defined in claim 4, in which:
- the integral conductive metal surface is formed by screen printing on the substrate a mixture of finely divided metal and glass in a binder; and
- heating the applied mixture at a temperature and for a time sufficient to adhere the mixture to the substrate.

7. A method according to claim 6, in which:
the conductive surface-forming mixture is heated at a temperature of not less than about 300 C. for not less than about 5 minutes.

8. A method according to claim 4, in which:
the barrier-forming mixture is heated at a temperature of not less than about 300° C. for not less than about 5 minutes.

9. A method as defined in claim 4, in which:
- the thick film mixture contains finely divided glass; and
- the applied thick film is heated at a temperature of not less than 300° C. to effect a bond between the thick film and the surface in contact therewith.

10. A method according to claim 9, in which:
heating is carried out in an inert atmosphere.

References Cited

UNITED STATES PATENTS

| | | | |
|---|---|---|---|
| 3,432,918 | 3/1969 | Riley et al. | 29—570 |
| 3,412,444 | 11/1968 | Klein | 29—25.41 |
| 3,241,008 | 3/1966 | Komisarek | 317—230 |
| 3,223,601 | 12/1965 | George | 204—56 |
| 3,144,328 | 8/1964 | Doty | 75—200 |

OTHER REFERENCES

Proceedings of the IRE, vol. 47, p. 1070, June 1959, Berry and Sloan.

JOHN H. MACK, Primary Examiner

R. L. ANDREWS, Assistant Examiner

U.S. Cl. X.R.

101—129; 117—70, 71, 107, 119; 148—13; 204—15, 298; 317—230